United States Patent [19]

Vernon

[11] Patent Number: 5,157,397
[45] Date of Patent: Oct. 20, 1992

[54] QUANTIZER AND RELATED METHOD FOR IMPROVING LINEARITY

[75] Inventor: Scott D. Vernon, San Diego, Calif.

[73] Assignee: TRW Inc., Redondo Beach, Calif.

[21] Appl. No.: 646,317

[22] Filed: Jan. 28, 1991

[51] Int. Cl.$^5$ .............................................. H03M 1/36
[52] U.S. Cl. ..................................... 341/157; 341/118
[58] Field of Search ........................ 341/118, 158, 159

[56] References Cited

U.S. PATENT DOCUMENTS

| | | | |
|---|---|---|---|
| 4,276,543 | 1/1981 | Miller et al. | 341/159 |
| 4,617,549 | 10/1986 | Reiner | 341/158 |
| 4,664,322 | 2/1987 | Fujita | 341/158 |
| 4,774,498 | 9/1988 | Traa | 341/159 |
| 4,870,417 | 9/1989 | van de Plassche et al. | 341/118 |
| 4,897,657 | 1/1990 | Brubaker | 341/159 |
| 4,924,225 | 5/1990 | Dingwall et al. | 341/118 |
| 4,928,103 | 5/1990 | Lane | 341/159 |

*Primary Examiner*—Marc Hoff
*Attorney, Agent, or Firm*—Noel F. Heal; G. Gregory Schivley; Ronald L. Taylor

[57] ABSTRACT

A technique for reducing the undesirable effects of amplifier offset voltages in quantizers such as analog-to-digital converters and related devices. The quantizer of the invention has an array of input amplifiers for comparing an input signal with multiple reference voltages, an array of latches for registering output signals from the amplifiers, and signal summing circuitry connected between the amplifiers and the latches, to produce a set of modified amplifier outputs for input to the latches, each of the modified amplifier outputs being derived from a weighted sum of at least three amplifier outputs. In the event of a defect in one or more amplifiers causing unwanted amplifier offsets, the summing circuitry improves linearity without the need for paralleling of transistor components. In one embodiment of the invention, the summing circuitry includes a resistor ladder to which the amplifier outputs are connected and from which the modified outputs are derived. In another embodiment, the number of modified amplifier outputs is greater than the number of original amplifier outputs, and the summing circuitry also performs an interpolation function, reducing the number of input amplifiers needed to achieve a particular resolution.

15 Claims, 9 Drawing Sheets

QUANTIZER AND RELATED METHOD FOR IMPROVING LINEARITY

BACKGROUND OF THE INVENTION

This invention relates generally to techniques for digitally quantizing a signal and, more particularly, to quantizers such as analog-to-digital (A/D) converters of the flash or fully parallel type.

In flash or parallel A/D conversion, an analog signal is applied to multiple identical comparators, one for each possible quantization level. For a device producing an n-bit digital output word, there are $2^n$ possible quantization levels and one fewer comparators. For example, an eight-bit A/D converter would have $2^8-1$ (=255) comparators. Each comparator receives two inputs. The analog input signal to be converted is applied to each of the comparators, and the other comparator inputs are tied to different, normally equally spaced voltages, usually derived from a reference resistance ladder. When a "convert" signal is applied to the comparators, each one tied to a reference voltage higher than the analog input signal produces a "1" output signal, and each one tied to a reference voltage below the analog input signal produces a "0" output signal. The resultant outputs are sometimes referred to as a "thermometer code" of "1's" and "0's" arrayed on each side of a transition point representing the analog input signal. The location of this transition is decoded to produce a digital output quantity equivalent to the analog input signal.

A critical problem in manufacturing these devices in monolithic form is that the comparators are sometimes not perfect. Transistor mismatches generate input offset voltages which effectively move the transition points of the comparators. For example, a comparator may switch (from "1" to "0" output) when the difference between its input voltages is 8 millivolts instead of zero. This type of defect generates unacceptable performance in a flash A/D converter if a large (8 millivolts) mismatch occurs in any one of the comparators. In practice, such defects are detected during testing, and devices with any significant defects are rejected, but the problem can have the effect of drastically reducing the yield of acceptable devices. Another effect of transistor mismatches is that higher speed wafer fabrication processes cannot be used to manufacture flash A/D converters, because fast processes typically have poor matching characteristics.

A transistor mismatch affects the linearity of the A/D converter. The transfer function of an A/D converter looks like a staircase. There are two roughly independent measurements of the linearity of this transfer function. Differential linearity refers to the uniformity of the step sizes. Any transistor mismatch will generate a larger or smaller step, causing a differential non-linearity at that comparator. Integral linearity refers to the worst case deviation from a straight line (ignoring the inevitable ½ steps). Although integral linearity is normally a measure of the overall bow of the transfer function, uneven step sizes due to transistor mismatches can be the dominant source of integral non-linearity.

Prior to this invention, transistor mismatch problems have, for the most part, been addressed by using parallel devices. In areas of the comparator circuit known to be most sensitive to mismatch, each transistor is duplicated by one or more identical transistors which are connected in parallel: collector to collector, base to base, and emitter to emitter. If any one transistor contains a defect, the mismatch effect will be reduced by the presence of parallel transistors without defects. A commonly used equivalent technique is simply to enlarge the sensitive devices. The costs of these approaches are the increase in size of the A/D converter, and the increase in the power required to drive the larger capacitors at high speeds.

A variant of the parallel transistor approach is called the "common centroid" scheme, in which the positions of the various paralleled transistors are utilized to further reduce mismatches. Two pairs of paralleled transistors are arranged in a square configuration, with the members of each pair being diagonally opposed, such that the centers of the pairs fall at the common center of the square. This scheme enhances the simple parallel transistor approach in situations in which the mismatches do not occur randomly, but in linear gradients across the device.

There is a technique known as analog interpolation, which has a coincidental similarity of structure that necessitates its discussion here. Analog interpolation is discussed in a paper entitled "An 8-bit Video ADC Incorporating Folding and Interpolation Techniques," by Rob E. J. Van de Grift et al., IEEE J. of Solid-State Circuits, Vol. SC-22, No. 6, pp. 944-953, Dec. 1987. The object of the interpolation scheme proposed in the paper is to reduce the number of input amplifiers used in the comparators. Large numbers of input amplifiers provide an undesirably high input capacitance, so the authors of this paper proposed a scheme in which many of the input amplifers are omitted entirely. However, if the device is to retain the same resolution as one with a full complement of input amplifiers, the outputs of the missing amplifiers have to be provided by some means. The following discussion assumes an interpolation factor of two. The technique suggested is that the output of a missing amplifier is provided by averaging the outputs of two adjacent amplifiers, on each side of the missing amplifier. Thus, although the number of input amplifiers is reduced by a factor of two in this case, a complete set of equivalent amplifier output signals is obtained by interpolating between each adjacent pair of available amplifier outputs. In other words, it is assumed that each missing amplifier output is midway between the outputs of the amplifiers on each side of the missing one. The circuit described in the paper mentioned above actually utilizes an interpolation factor of 4, where 3 out of 4 amplifiers are omitted and surrogate output waveforms are reconstructed from the remaining amplifiers. Again, the goals of interpolation are to reduce both the input capacitance and component count of the A/D converter.

A pleasant side effect of interpolation is an improvement in differential linearity. This occurs because any transistor mismatch which occurs in one of the remaining amplifiers affects the step size of more than one comparator. Thus, instead of causing a single large error, the effect of the mismatch is distributed as smaller errors over a larger number of comparators. For example, if an amplifier has a transistor mismatch equal to the size of the quantization step, then that comparator would have a 1 least significant bit (LSB) error. With an interpolation factor of 4, the next comparator down would have a ¾ LSB error, followed by ½ LSB and ¼ LSB in the next comparators. Note that the step size from a 1 LSB to a ¾ LSB error is ¼ LSB. Thus the single large error is translated into 4 errors of ¼ size each, resulting in a factor of 4 improvement in differential linearity. However, interpolation does not reduce the effect of a transistor mismatch on integral linearity. In the example above, the integral non-linearity is 1 LSB, unaffected by the interpolation.

It will be appreciated from the foregoing that another technique is needed to reduce the effects of transistor mismatches. The new technique should avoid the large number of components and the speed penalty associated with parallel devices, and should improve integral linearity unlike interpolation. The present invention achieves this goal, as will become apparent from the following summary.

SUMMARY OF THE INVENTION

The present invention resides in a quantizer having multiple amplifiers coupled to an array of reference voltages, and from which output signals are determined from the average or sum of the outputs of at least three of the amplifiers. Briefly, and in general terms, the invention comprises a plurality of amplifiers having input terminals and output terminals, means for coupling an array of input reference signals to input terminals of the amplifiers, a plurality of threshold circuits (e.g. latches), and signal combining means connected between the amplifiers and the latches. For purposes of this invention, the term "latches" shall refer to any of the various types of thresholding circuits which produce a digital output indicative of whether or not an analog input signal has crossed a certain threshold. Examples are comparators, comparators with hysteresis, latches, flip-flops, R-S latches, differential amplifiers and amplifiers. The signal combining means receives signals from the output terminals of the amplifiers, and provides input signals to the latches. Each of the latches receives an input signal derived from the weighted sum of the outputs from at least three amplifiers operating in a non-saturated mode. Summing outputs from multiple amplifiers has the effect of improving linearity in the event of any amplifier offset errors, and thereby minimizes the effect of offset errors without costly paralleling of transistor circuits. In the illustrative embodiment of the invention, the amplifiers are positioned in a sequence corresponding to the values of the input reference signals and the latches are positioned in a similar sequence. The signal summing means derives each latch input signal from the outputs of a principal amplifier located at a position corresponding to the latch, and from a plurality of other amplifiers on each side of the principle amplifier.

In one form of the quantizer, there are equal numbers of latches and amplifiers, and the signal summing means provides a latch n input that is proportional to the sum of the output from amplifier n, and the outputs from amplifiers $n-1$ and $n+1$ multiplied by a weighting factor. In another form of the quantizer, there are N amplifiers and M latches, where N is less than M. The signal summing means has N inputs and M outputs, and performs an interpolation function as well as a summing function, wherein an output signal on any of the M outputs is derived by interpolating between the closest of the N inputs, and by adding weighted contributions from others of the N inputs, such that the amount of weighting is determined by distance from the closest of the N inputs.

In the embodiments illustrated, the signal summing means is a resistor ladder having a first set of tap points that form the input terminals and a second set of tap points that form the output terminals. In specific forms of the ladder, the two sets of tap points may coincide partially or completely, or may be entirely non-coincident.

The amplifiers in the quantizer of the invention may be differential amplifiers. In one disclosed embodiment, each differential amplifier has an emitter-follower output stage, the signal summing means includes a resistor ladder having 2N input taps and 2M output taps, and the quantizer circuit further comprises 2N coupling resistors connecting the emitter outputs of the emitter follower stages to the resistor ladder, to effect weighted summing of the inputs to the ladder. An alternative form of the quantizer is disclosed, in which there are no emitter-follower stages and the outputs of the amplifiers are directly coupled to the resistor ladder.

The invention may also be defined in terms of a fully parallel analog-to-digital converter, including a plurality of amplifiers each having two input terminals and output terminals, a reference signal resistor ladder, to provide an array of input reference signals to a first of the input terminals of the amplifiers, means for coupling an analog input signal to the other of the input terminals of the amplifiers, a plurality of threshold circuits (e.g. latches), signal summing means, and a decoder. Each amplifier generates a signal indicative of the difference between the analog input signal and an input reference signal corresponding to one of a plurality of reference levels typically uniformly spaced over an analog signal range of interest. The signal summing means is connected between the amplifiers and the latches, to receive signals from the output terminals of the amplifiers, and to provide input signals to the latches. Each of the latches receives an input signal derived from the sum of the outputs from at least three amplifiers operating in a non-saturated mode, and the summing of outputs from multiple amplifiers has the effect of improving linearity in the event of any amplifier offset errors. The decoder receives signals from the latches and generates a digital output signal indicative of the magnitude of the analog input signal.

In terms of a novel method, the invention comprises the steps of comparing the analog input signal with a plurality of reference signals in a plurality of amplifiers, generating in the amplifiers a plurality of output signals indicative of the difference between the analog input signal and the plurality of reference signals, operating the amplifiers in such a manner that at least three of the amplifiers are in a non-saturated condition producing an output approximately proportional to the difference between the analog input signal and the reference signal applied to the amplifier, and adding to each amplifier output signal an additional signal proportional to the outputs of at least two nearby amplifiers. This provides modified output signals derived from a weighted average of at least three amplifiers. Therefore, any offset condition in one of the amplifiers is diluted by input from neighboring amplifiers, to maintain an acceptable level of linearity.

In one form of the invention, the method also includes the step of interpolating between adjacent modified amplifier output signals to obtain additional modified output signals, and a higher level of resolution without the need for corresponding amplifiers.

In another form of the invention, the method includes the step of folding the analog input signal during the amplification step. This results in fewer latches at the same level of resolution.

It will be appreciated from the foregoing that the present invention represents a significant advance in the field of quantizers, especially as designed for use in analog-to-digital converters. In particular, the invention provides a technique for reducing the effects of amplifier offset errors without having to add parallel transistor components. Specifically, by combining each amplifier output with weighted contributions from neighboring amplifiers, the effect of amplifier offsets on differential and integral linearity are minimized. The technique of this invention can also be expressed as a method for accurately amplifying an array of input signals. An example of the array of input signals that can be amplified by this invention is the set of differences between the analog input signal and the various reference voltages in quantizers such as full parallel A/D converters. The invention utilizes many amplifiers connected to the input signals. Outputs are then formed from the weighted average of the outputs of at least three of the amplifiers which are in their non-saturated region. This results in a reduction in the effects of the offset voltages in the various amplifiers, and the resulting accurately amplified voltages can be further processed to obtain a quantization of the analog input signal.

One important application of the invention is to use it in combination with trimming techniques such as laser trimming, zener zapping, metal fusing, or auto-calibration. The invention generates superior differential linearity, and also allows the ability to trim the integral linearity of many amplifiers from a single trim point. This reduces the number of trim points below that of a traditional flash A/D converter which requires one trim point per comparator. Other aspects and advantages of the invention will become apparent from the following more detailed description, taken in conjunction with the accompanying drawings.

DETAILED DESCRIPTION OF THE PREFERRED EMBODIMENTS

Figure 1:
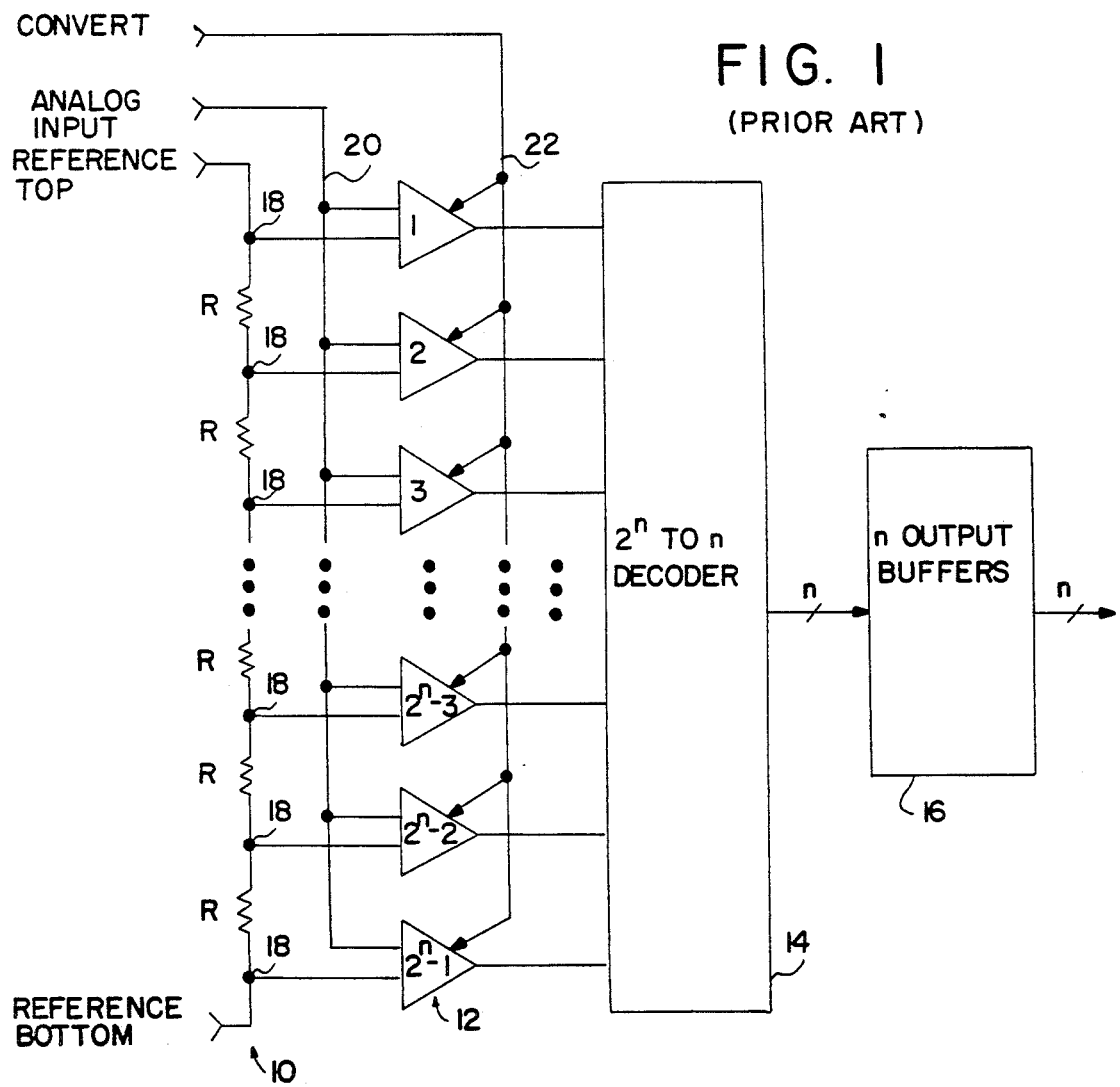
FIG. 1 is a block diagram of a typical flash analog-to-digital (A/D) converter of the prior art.

As shown in the drawings for purposes of illustration, the present invention is concerned with improvements in quantizers. The invention is described in the context of analog-to-digital (A/D) converters of the flash type, but it will be understood that the principles of the invention also have application to other devices employing multiple amplifiers in a similar manner to A/D converters, such as digitizing peak detectors, combination A/D-D/A circuits, differential A/D converters, folding A/D converters, interpolating A/D converters, etc. Also, the invention can be applied to converters with nonlinear transfer functions, such as high speed synchro-to digital converters, resolver-to-digital converters, phase quantizers, logarithmic A/D converters, A/D converters with increased resolution in certain areas of the full scale range, etc.

As shown in FIG. 1, an A/D converter of the flash type includes a reference resistor ladder, indicated generally by reference numeral 10, a plurality of comparators 12, a decoder 14, and a set of output buffers 16. In the usual case, the reference resistor ladder 10 is simply a series-connected string of equal resistors R, as shown. A known reference voltage is connected across the ladder, and voltages from zero to a full-scale reference value are picked off from tap points of the ladder, as indicated at 18, for connection to inputs of the comparators 12. An analog signal input line 20 is connected in common to a second input terminal of each of the comparators. A "convert" control signal line 22 is also connected to each of the comparators 12 to control the timing of the conversion process.

Figure 2:
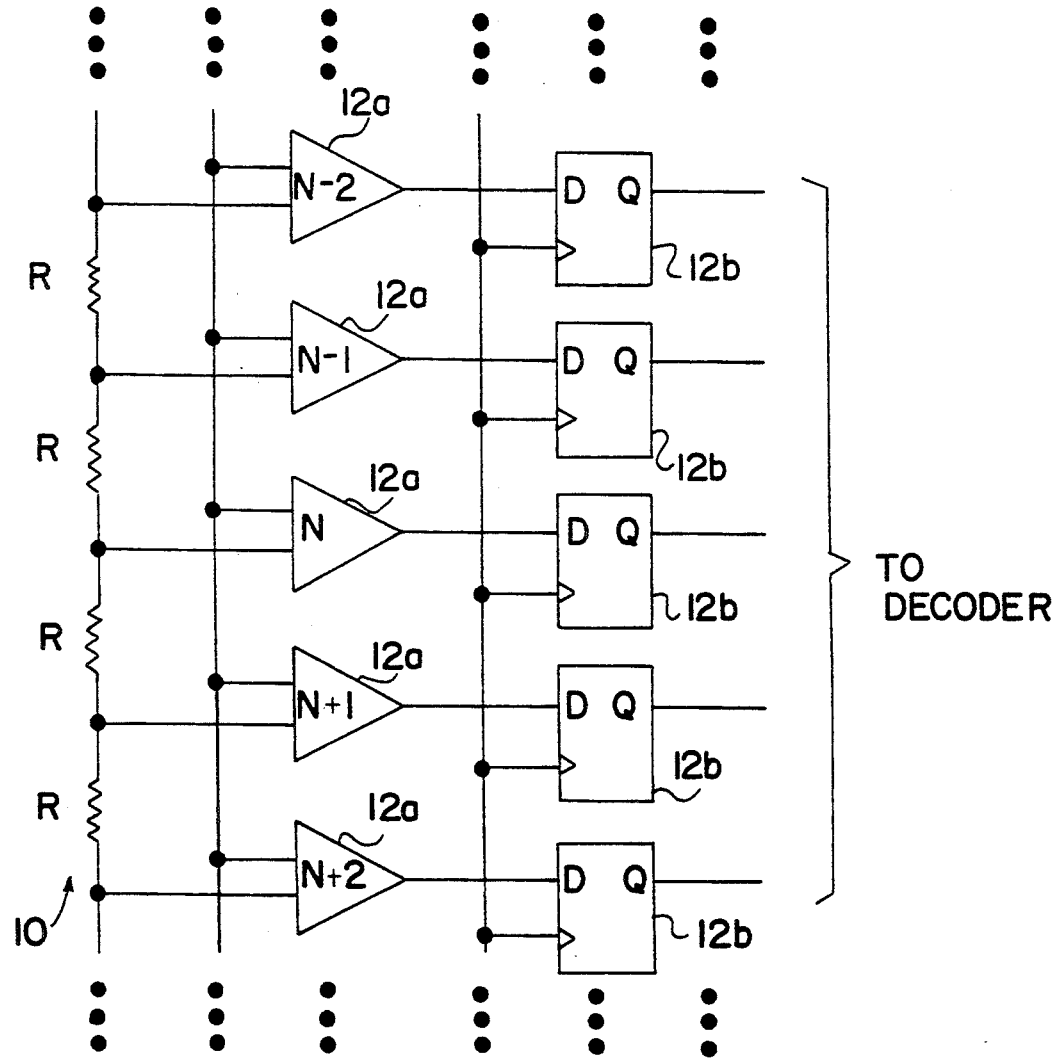
FIG. 2 is a block diagram showing further detail of the comparators of FIG. 1.

As shown in FIG. 2, each comparator 12 includes an amplifier 12a, and a threshold circuit 12b in the form of a D-type flip-flop. The amplifiers 12a continuously amplify the difference between the analog input signal on line 20 and the reference voltages applied on their other terminals from the reference resistor ladder 10. The output of the amplifiers 12a are typically differential signals such that they can represent whether the analog input signal is above or below the reference voltages of the comparators. This amplifier output signal is applied to the differential D inputs of the D-type flip-flops 12b. These flip-flops perform a thresholding function as follows. If the differential D input is greater than some defined value (typically zero) then the flip-flops read the signal as being equivalent to a binary "1." If the D input is more negative than the same defined value then they consider the input as being a binary "0." When a "convert" signal is applied on line 22, the flip-flops latch the state at their D inputs. From there the binary outputs are gated into the decoder 14. The decoder 14 converts the "thermometer code" of "1's" and "0's" from the comparators, into a corresponding n-bit digital value indicative of the location of the transition between the "1's" and "0's."

Figure 3:
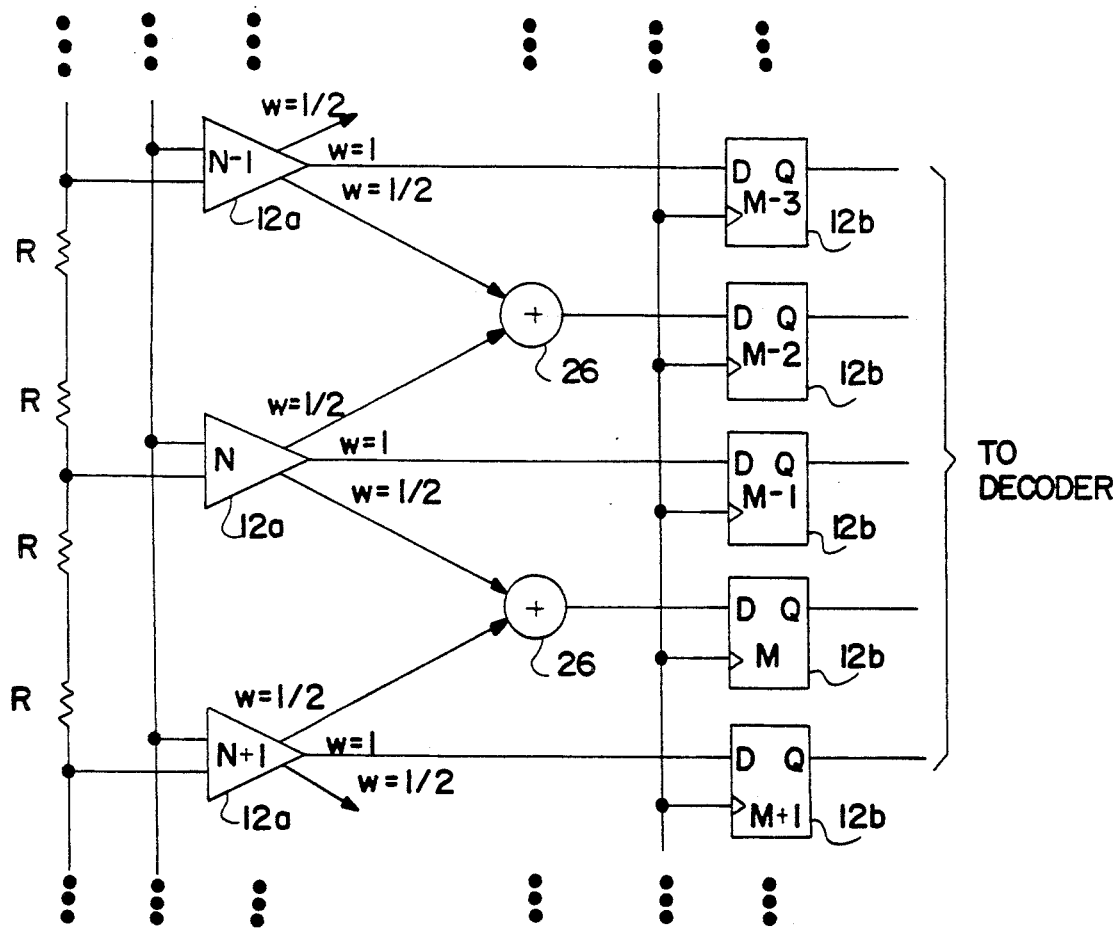
FIG. 3 is a block diagram showing the prior art technique of analog interpolation.

FIG. 3 shows a technique that has been proposed for reducing the number of amplifiers 12a in a flash A/D converter. For good resolution large numbers of amplifiers are needed, and this results in a larger than desired input capacitance value for the A/D converter. In the FIG. 3 technique, known as analog interpolation, fewer amplifiers are used. It will be observed, for example, that there are two resistors between amplifiers N−1 and N, and two between amplifiers N and N+1. In the block diagram of FIGS. 1 and 2, an amplifier is connected to every tap point of the reference resistor ladder 10. In FIG. 3, alternate amplifiers have been omitted. Without further change, this would increase the voltage step between adjacent comparators, and the resolution of the device would also be made coarser by a factor of two. However, the device also includes summing junctions 26 located between amplifiers, and each is connected to receive a one-half contribution from each adjacent amplifier. In effect, each summing junction produces a signal proportional to the average of the signals from the adjacent amplifiers. Each summing junction 26 also has its own latches 12b, which are operated as though their inputs were derived from separate amplifiers. Thus the latches 12b produce $2^n-1$ outputs for decoding, even though only approximately half that number of amplifiers is used.

Figure 4:
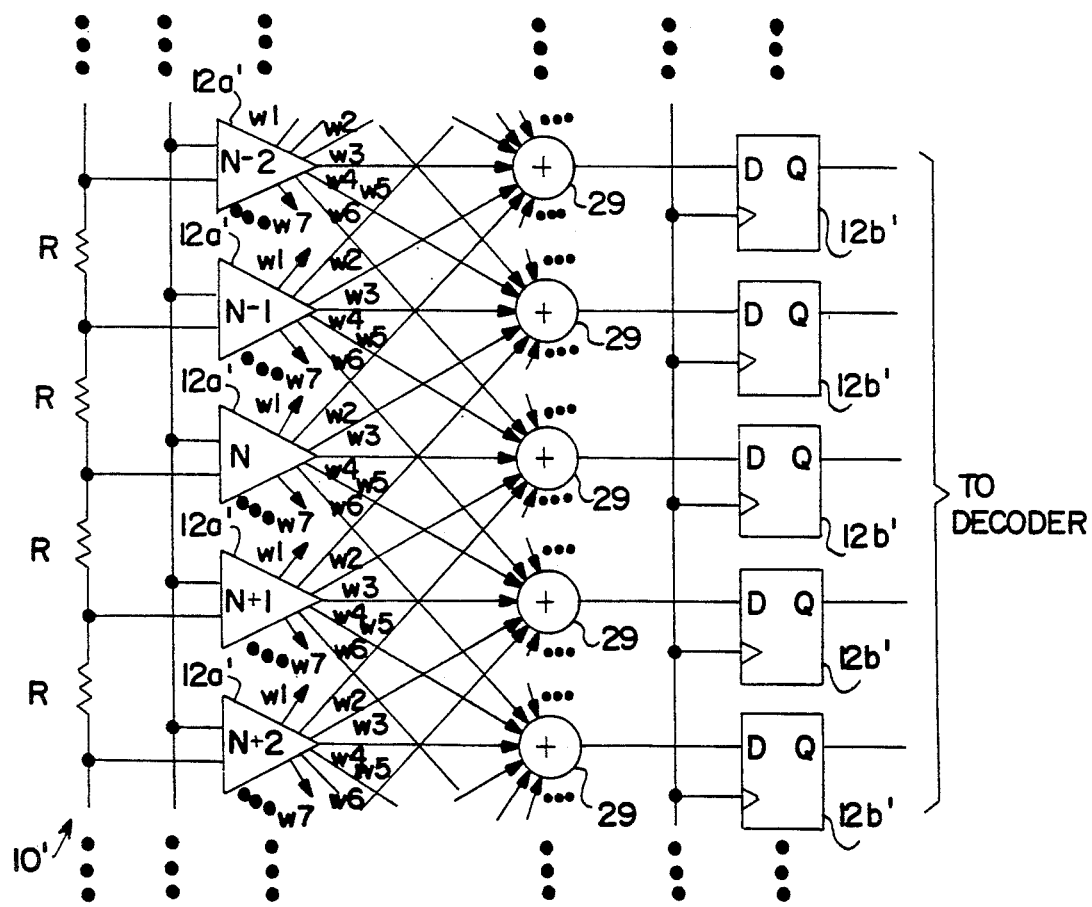
FIG. 4 is a block diagram of a flash A/D converter in accordance with the present invention.

In accordance with the invention, and as shown in FIG. 4, a quantizer includes a reference resistor ladder 10', a plurality of amplifiers 12a', of which there is one for each level of the resistor ladder, an equal number of latches 12b', and an equal number of multiple-input summing junctions 29 between the amplifiers and the latches. Each of the amplifiers effectively produces at least three outputs. One such output is connected to a first summing junction directly corresponding to the amplifier from which it was generated, and two outputs are connected, respectively, as inputs to the two summing junctions at positions adjacent to the first summing junction. Additional pairs of outputs may be generated for connection to pairs of summing junctions located at greater distances from the first summing junction. Therefore, each of the junctions 29 is capable of receiving inputs from at least three amplifiers 12a'.

The manner of operation of the circuit of FIG. 4 will be apparent if the case of a single amplifier having a transistor mismatch is analyzed. The effect of the offset will be lessened because the output of this amplifier is always added to the outputs of the other amplifiers before the first amplifier output signal is utilized by any latch. This reduces the effects of any transistor mismatch by a factor which is determined by the number of amplifiers which are summed. This is similar in some ways to parallel devices except that very few components are added to achieve a large number of summed amplifiers. Furthermore, the amplifiers are not connected in parallel but to different points along the reference resistor. The fact that this invention functions accurately with minimal added components will be explained below.

First, the operation of the invention will be explained for the case of no amplifier offset voltages. The summation of amplifier output voltages from amplifiers which are tied to different voltages along the reference resistor ladder could conceivably cause an unwanted change in the performance of the A/D converter. To avoid this change, this invention arranges for the cancellation of the contributions of the amplifiers from "above" a given amplifier with the contributions of the amplifiers from "below" that given amplifier. This cancellation is described by the following example. Consider a circuit in which only three amplifier outputs are combined at each junction. Assume weighting factors of 1.0 for the center amplifier, and 0.8 for the contributions from the two adjacent amplifiers. Assume also that the analog input voltage is fixed at a reference ladder tap point corresponding to a comparator N. In the first instance, also assume that there are no offset errors in the amplifiers, that Q is the size (in millivolts) of each Q-step between adjacent steps of quantization, and A is the amplification gain of each amplifier. Under these conditions, the output of the amplifier above N, i.e. amplifier N+1, will exactly cancel the output of the amplifier below N, i.e. amplifier N−1. This will occur if the weighting of the adjacent amplifiers is symmetrical about N and if the amplifiers are in their region of symmetrical amplification, i.e. equal amplification of both positive and negative input voltages. TABLE 1 indicates the numerical input and output levels for the situation just described. If the weighting were not symmetrical about N, the result would be an offset error for the entire A/D converter which is not considered to be a significant problem.

TABLE 1

| Comp. No. | Amp. input | Amp. output | Junction output |
|---|---|---|---|
| N + 2 | 2Q | 2QA | 2.4QA + 2QA + 0.8QA = 5.2QA |
| N + 1 | Q | QA | 1.6QA + QA + 0 = 2.6QA |
| N | 0 | 0 | 0.8QA + 0 − 0.8QA = 0 |
| N − 1 | −Q | −QA | 0 − QA − 1.6QA = −2.6QA |
| N − 2 | −2Q | −2QA | −0.8QA − 2QA − 2.4QA = −5.2QA |

It will be noted that the basic functionality of the converter is preserved. In a conventional A/D converter, the amplifier outputs are applied directly to the latch circuits, and a step value of QA is applicable at each step, after amplification. When the averaging technique of the invention is used, the step value is 2.6QA, after amplification and summing, and this applies uniformly from step to step, i.e. there is no degradation in linearity.

Next, consider the same configuration, but with a nonzero offset voltage for comparator N. This can be represented by setting the input voltage for comparator N at Q instead of zero. Normally, this would generate a differential and integral linearity error equal to 1 LSB, i.e. one least significant bit of the converter. TABLE 2 shows the result of introducing this offset error.

TABLE 2

| Comp. No. | Amp. input | Amp. output | Junction output |
|---|---|---|---|
| N + 2 | 2Q | 2QA | 2.4QA + 2QA + 0.8QA = 5.2QA |
| N + 1 | Q | QA | 1.6QA + QA + 0.8QA = 3.4QA |
| N | Q | QA | 0.8QA + QA − 0.8QA = QA |
| N − 1 | −Q | −QA | 0.8QA − QA − 1.6QA = −1.8QA |
| N − 2 | −2Q | −2QA | −0.8QA − 2QA − 2.4QA = −5.2QA |

In this case, the outputs of the summing junctions do not progress in a perfectly uniform manner from comparator to comparator. However, the progression is at least monotonic, in contrast to the borderline monotonic performance of the conventional converter architecture, shown in the amplifier output column of Table 2.

An actual quantitative comparison of the differential and integral linearity performance of the two architectures is more complicated than the above tables, since the analog input signal must be varied and the resulting output transition points calculated. This can be achieved by adding a variable X to the amplifier inputs, setting the junction outputs to zero, and solving the resulting equation for X. The calculations for the conventional architecture are performed in the same manner except that the amplifier outputs are used instead of the junction outputs in the equation. The results are shown in TABLE 3.

TABLE 3

| Transition Designation | Effective Q-step size (conventional) | Effective Q-step size (with summing) |
| --- | --- | --- |
| N + 3 to N + 2 | 1.0 Q | 1.000 Q |
| N + 2 to N + 1 | 1.0 Q | 0.692 Q |
| N + 1 to N | 0.0 Q | 0.923 Q |
| N to N − 1 | 2.0 Q | 1.077 Q |
| N − 1 to N − 2 | 1.0 Q | 1.308 Q |
| N − 2 to N − 3 | 1.0 Q | 1.000 Q |
| Differential Linearity Error | 1.00 LSB | 0.308 LSB |
| Integral Linearity Error | 1.00 LSB | 0.385 LSB |

Differential linearity at a position n is commonly defined as:

$$1\text{LSB} \times (Q_n - Q)/Q,$$

where $Q_n$ is the perceived subrange width at n (expressed in millivolts), and Q is the Q-step of the A/D converter, which equals the full scale range of the converter divided by the number of comparators.

Figure 5:
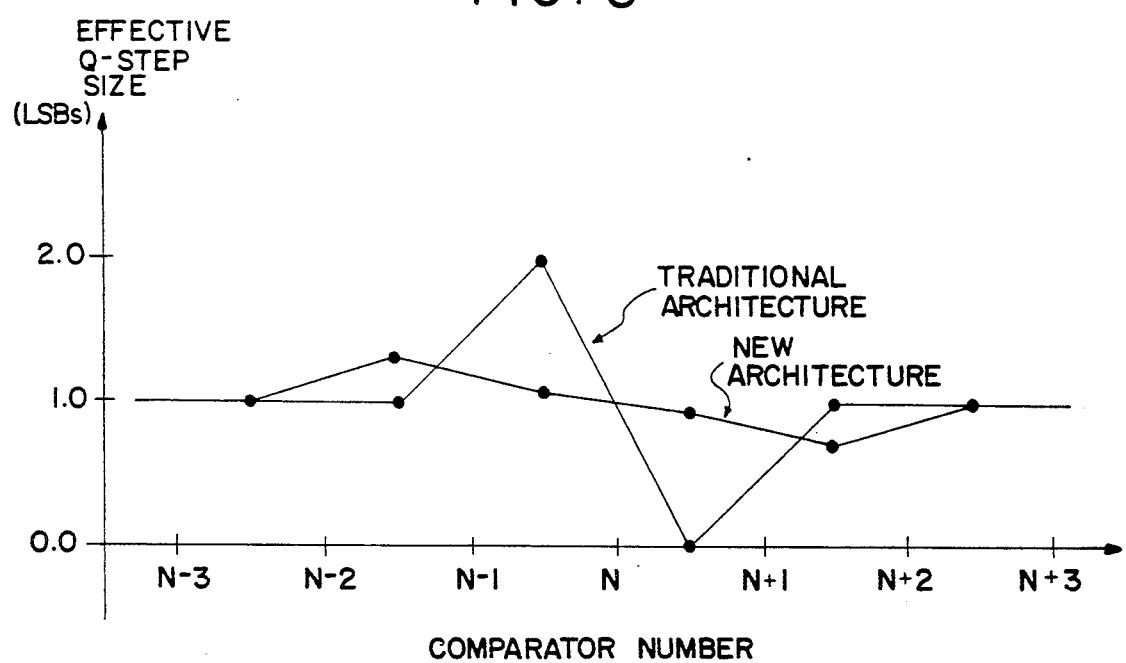
FIG. 5 is a graph showing the effect of a comparator offset on the code size for a conventional quantizer and for the quantizer of the present invention.

Integral linearity at a position n is commonly defined as:

SUMMATION OF DNL(K) FROM $K=1$ TO $N$ where DNL(k) is the differential linearity at the position k as defined above. (Note that the summation is done from the bottom upwards in Table 3. Also, note that there are alternative methods of defining the linearity of A/D converters which tend to partially mask the improvements which result from the present invention.) Table 3 shows the step size at every step, and the worst case differential and integral linearity among all steps. FIG. 5 shows a plot of the step sizes for both the conventional circuit, and for the circuit of the invention.

Table 3 shows that the circuit of the invention improves differential linearity by a factor of 3.3, and improves integral linearity by a factor of 2.6, in this typical example. The improvement in integral linearity results from the same mechanism as that which improves integral linearity with parallel devices. The mechanism is that the signal from the amplifier with the transistor mismatch forms only a portion of the input to the latches. The latches also receive input from other "perfect" amplifiers, which tends to reduce the effect of the mismatched amplifier. In the example above, the latch in comparator number N received input from amplifier N with a weighting of 1.0, and the total contributions from the amplifiers in N−1, N, and N+1 was 0.8+1.0+0.8=2.6. Thus the effect of the transistor mismatch was reduced by a factor of 2.6/1.0=2.6, which agrees with the integral linearity improvement calculated above. It can be seen that the integral linearity improvement is increased if each latch receives inputs from as many amplifiers as possible, with the weights ideally being equal for all amplifier contributions.

The improvement in differential linearity is the result of two mechanisms, one of which is the same as that which improves integral linearity. The second mechanism which improves differential linearity is the fact that differential linearity is always measured between adjacent comparators. If there is a transistor mismatch in an amplifier which pulls its output negatively, this will pull the adjacent comparators in a negative direction also. This causes adjacent comparators to have roughly equal errors, such that the distance between them is very close to ideal. This second benefit can be improved by the proper choice of weighting factors; however, improving differential linearity in this manner reduces the improvement in integral linearity. The weighting should be chosen to improve integral linearity since good integral linearity will virtually guarantee good differential linearity, while the converse is not true.

Figure 6:
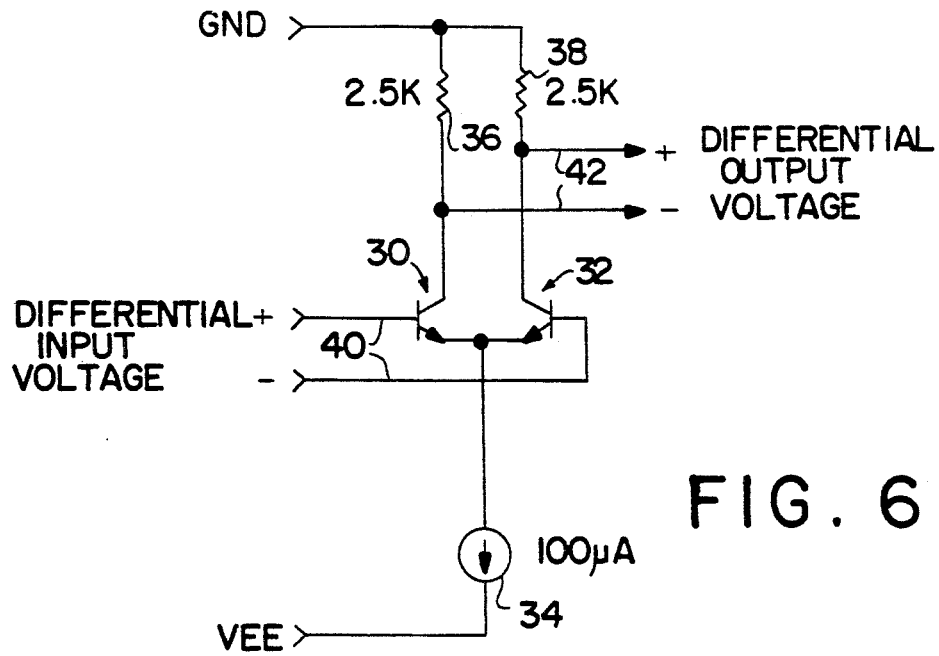
FIG. 6 is a schematic diagram of a differential amplifier used in prior art quantizers of the type with which the invention is concerned.
Figure 7:
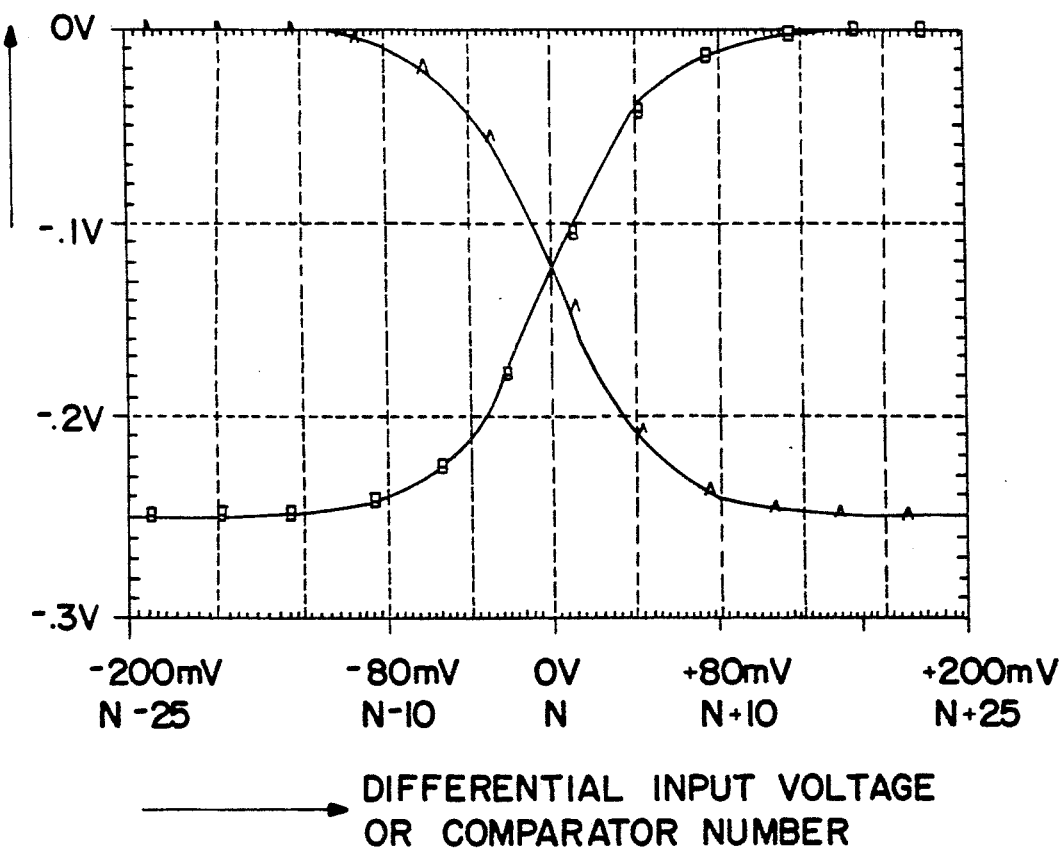
FIG. 7 is a graph showing typical operating characteristics of a differential amplifier such as the one shown in FIG. 6.

FIG. 6 is a schematic diagram of a differential amplifier of the type used in quantizers. Basically, the amplifier shown consists of a pair of NPN transistors 30, 32 connected as a differential pair. The emitters are connected in common to a power supply, through a constant current source 34, and the collectors are each connected through separate resistors 36, 38 to another power supply or to ground. A differential input voltage is applied to the bases of the transistors, as indicated at 40, and a differential output voltage is obtained from the collectors, as indicated at 42. FIG. 7 shows the operating characteristics of this amplifier, plotting the output voltages as a function of input voltage. When the input voltage is high in a negative sense, transistor 30 is not conductive, and output from its collector is at zero volts. At the same time, transistor 32 is conductive and its collector voltage is at about −0.25 volts, as indicated in FIG. 7. When the input voltage is switched to the opposite polarity, the output of the two transistors are switched to opposite senses, as indicated at the right-hand end of FIG. 7. As also indicated in FIG. 7, there is a significant region between the two saturated conditions of the transistors, in which both are operated in a non-saturated and roughly linear manner. That is to say, the differential output voltage is linearly related to the differential input voltage. This non-saturated operational region is extremely important to operation of the invention, since it is only when the amplifiers are operating in this region that it makes any sense to sum or average the amplifier outputs. For purposes of this invention, the term "saturated" shall be used to mean "limited," and does not necessarily refer to the condition of forward bias of a base-collector junction. In accordance with one aspect of the present invention, the amplifiers are designed in such a way that the non-saturated region of the characteristic curve encompasses as many as ten or eleven comparator steps. In other words, at the point of transition, or the point at which a comparator inputs are equal, there will be a number of comparator amplifiers on either side of this point that are operating in their non-saturated region. This will permit the summing of as many as eleven amplifier outputs at each summing junction in the circuit.

Figure 8:
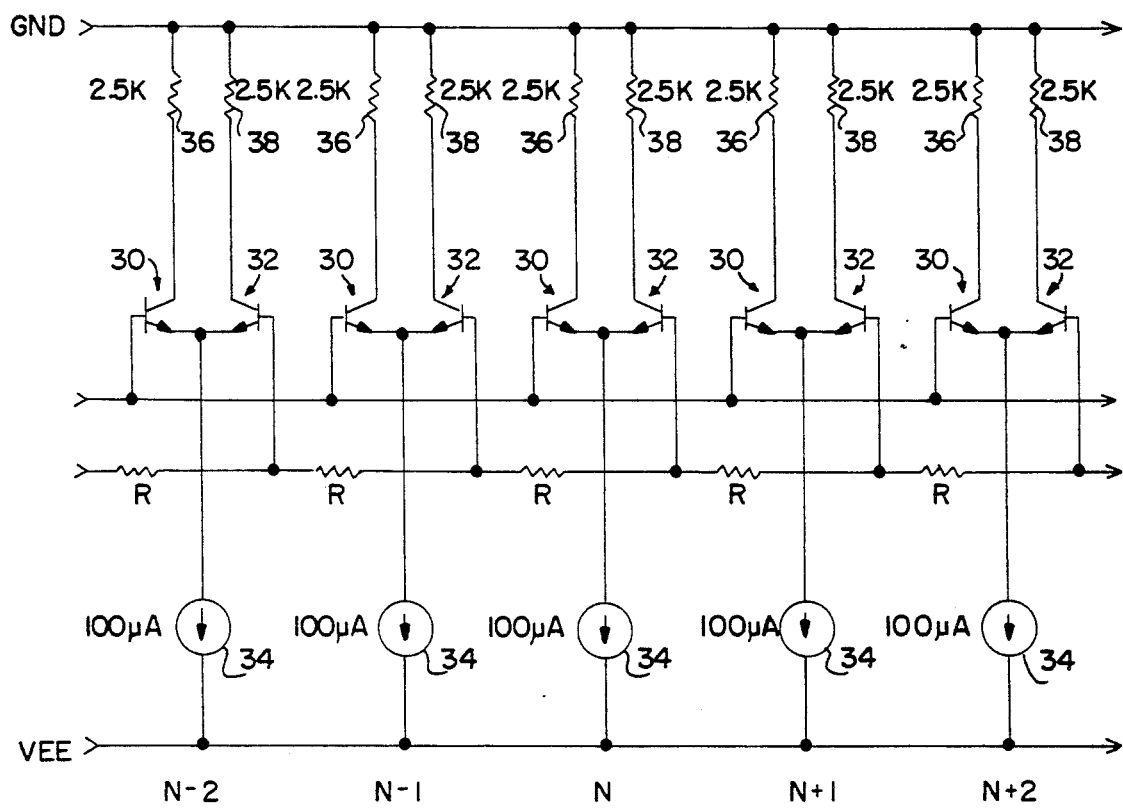
FIG. 8 is a schematic diagram of a differential amplifier array connected in a conventional manner.

FIG. 8 shows an array of differential amplifiers in a conventional quantizer. Each amplifier in the array has two transistors 30, 32, a current source 34 and two load resistors 36, 38. A reference resistor ladder 10 has tap points connected to base terminals of transistors 32, and an analog input signal line 20 is connected to the base terminals of the other transistors 30. The output connections from the collector terminals of the transistors are not shown, but would be direct connections to latch circuits, which have also been omitted from this figure.

Figure 9:
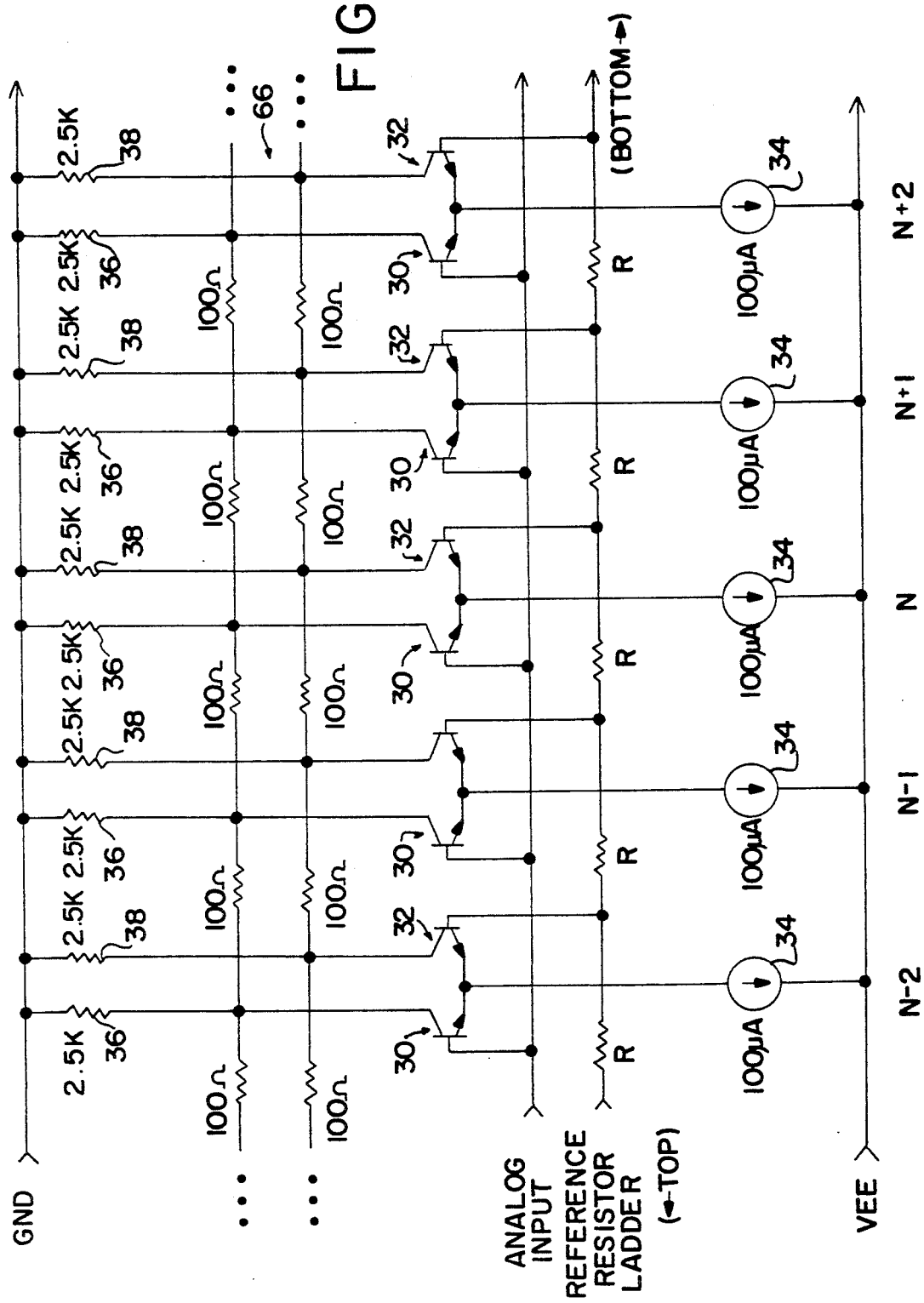
FIG. 9 is a schematic diagram similar to FIG. 8, but connected in accordance with the present invention.

For comparison, FIG. 9 shows a similar schematic to FIG. 8, but with the necessary connections to effect weighted summing of the amplifier outputs. Instead of a direct implementation of the FIG. 4 block diagram, each of the outputs from the differential amplifiers is coupled to a summing resistor ladder, comprising two series-connected strings 66 of typically equal resistors. One string is connected between all of the collector terminals of transistors 30, and the other string is connected between all of the collector terminals of the other transistors 32. The effect of the resistors in these strings is to couple the output of each amplifier to adjacent amplifier output circuits in such a way that each amplifier output signal is modified to have contributions from many other amplifiers. This resistor ladder implements the mixing or summing feature at a cost of only two additional resistors per amplifier.

The use of equal resistors in the summing circuit assumes that the steps of reference voltage applied to the amplifiers are uniformly spaced. The technique of the invention will still be effective, however, if the reference voltage steps are non-uniform. Non-uniform voltage steps are useful for implementing logarithmic, piecewise linear, trigonometric, or other nonlinear transfer functions. The only requirement in this regard is that the resistor ladder used for signal summing should mimic the resistor ladder used to provide the reference voltage steps to the amplifier inputs.

Figure 10:
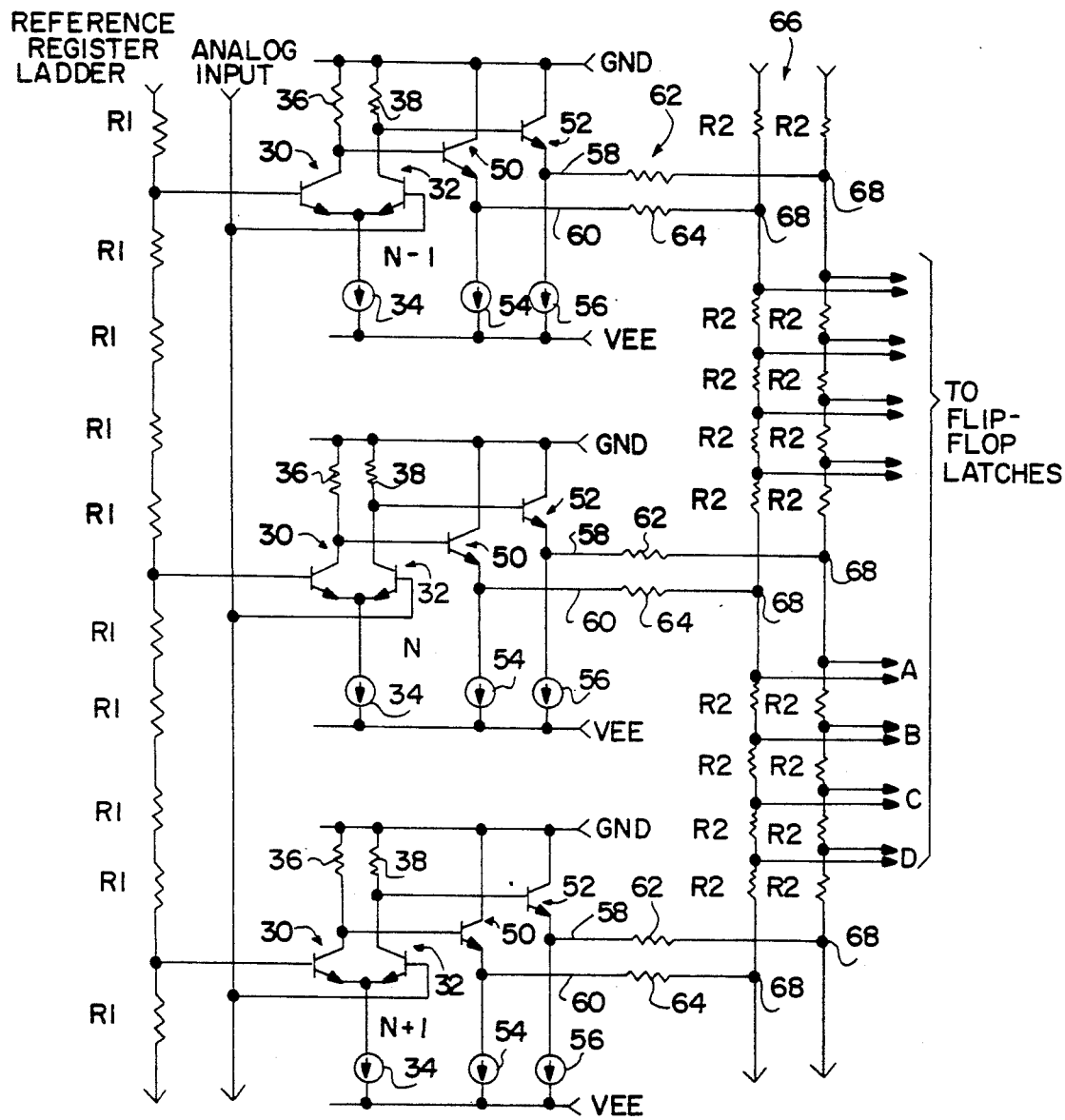
FIG. 10 is a schematic diagram of a portion of a quantizer employing the principle of the present invention combined with analog interpolation.

FIG. 10 is a schematic combining the summing or averaging feature of the invention with analog interpolation. In FIG. 10, each differential amplifier pair 30, 32 drives an emitter-follower transistor pair 50, 52. Each transistor 50, 52 has its collector connected to ground and its emitter connected to the power supply through separate current sources 54, 56. The output signals on the collectors of transistors 30, 32 are connected to the bases of transistors 50, 52, and the emitter-follower pairs provide a differential output on lines 58, 60. These lines are connected through averaging resistors 62, 64 to tap points in an interpolation resistor ladder 66 having two strings of series-connected resistors. In the embodiment shown, the lines 58, 60 are connected to four resistors of value R2 providing four tap points, indicated as A, B, C, D, between each amplifier output.

The averaging resistors 62, 64, allow interaction among the outputs of the amplifiers, such that the output at A, for example, receives weighted contributions from several other amplifiers. Without the averaging resistors 62, 64, the low output impedance of the emitter follower pairs 50, 52 relative to the interpolation resistor ladder impedance (equals $4 \times R2$), would prevent this interaction. The output of amplifier $N-1$, for example, could not then contribute significantly to the outputs A, B, C, D between amplifiers N and N+1. The lack of interaction is the reason that interpolation does not improve integral linearity. Referring to FIG. 10, if the amplifier N has an offset, and no averaging resistors are used, then the offset would appear unattenuated at the input of latch A, resulting in an integral linearity error. Thus, interpolation has only one of the two benefits which result from the present invention, i.e. if an offset pulls an amplifier offset negatively, it will pull the surrounding latch inputs negatively also, which improves differential linearity since this is measured between adjacent comparators. However, the other mechanism which improves both integral and differential linearity does not result from interpolation. This other mechanism is a direct result of the averaging used in the present invention and in parallel devices.

Interaction among the outputs of the amplifiers could also be achieved by eliminating the emitter-follower pairs 50, 52 and connecting the collector outputs of the differential amplifiers 30, 32 directly to the interpolation resistor ladder 66. This is similar to the construction of FIG. 9, but further includes the interpolation feature as well.

It will be observed that the outputs B, C, D are obtained as a result of interpolating between the outputs of adjacent amplifiers and as a result of averaging or summing outputs from other amplifiers. This form of the invention provides benefits in two ways. First, summing or averaging improves the differential and integral linearity of the device without the costs associated with parallel devices, namely reduced speed and increased component count. Second, interpolation reduces the component count since the number of amplifiers can be reduced by a factor of two or more, and the A/D converter input capacitance is reduced by the same factor. Interpolation will also improve differential linearity; however, integral linearity will be the limiting factor on the linearity of the device.

In the embodiment of FIG. 10, there are four interpolated outputs for each amplifier. Another use for this technique is to allow laser trimming of the linearity of devices such as A/D converters. Naturally, the invention is not limited to this configuration. Interpolation may eliminate only alternate amplifiers, or seven out of eight, by way of further example. Moreover, as explained, the emitter followers and averaging resistors may be eliminated by connecting the amplifier collectors directly to the interpolation ladder. This configuration allows interaction among the amplifier outputs, hence averaging, since the amplifier output impedance is large relative to the interpolation resistor ladder impedance. Interpolation can also be achieved by a variety of circuits other than the resistor ladder shown in FIG. 10.

The goal of the invention is to reduce the effects of transistor mismatches on the linearity of devices such as flash A/D converters. Another use for this technique is to allow laser trimming of the linearity of devices such as A/D converters with relatively few trim points. Use of this invention in combination with analog interpolation can result in a reduced component count, and reduced device input capacitance.

The invention can also be used in combination with analog folding. Analog folding is a technique which is described in several papers, namely one by A. Arbel and R. Kurz, "Fast ADC," IEEE Transactions on Nuclear Science, Vol. NS-22, pp. 446–51, February 1975, and one by Rob E. J. Van de Grift et al., "An 8-bit Video ADC Incorporating Folding and Interpolation Techniques," IEEE Journal of Solid-State Circuits, Vol. SC-22, No. 6, pp. 944–53, December 1987. The latter paper also describes interpolation. These papers describe two types of folding amplifiers which can be used to reduce the number of latches required for a given resolution A/D converter. A slightly different method of achieving the same goal is the use of folding amplifiers to achieve analog encoding, as described in a paper by J. Corcoran et al., "A 400 MHz 6b ADC," 1984 IEEE International Solid-State Circuits Conference Digest of Technical Papers, pp. 294–95, February 1984. The Corcoran paper refers to a patent by T. W. Henry and M. P. Morganthaler, "Direct Flash Analog-to-Digital Converter and Method," U.S. Pat. No. 4,386,339. The folding techniques presented in the papers mentioned above can be combined with the present invention by replacing the amplifiers specified in the present invention with folding amplifiers. In this embodiment, three or more of the folding amplifiers should be in their non-saturated region to provide significant reduction in the effects of transistor mismatches in the folding amplifiers.

The benefits associated with the invention are not entirely without cost. An A/D converter which utilizes averaging requires a more careful design than one which utilizes traditional techniques. This is because averaging introduces sensitivities to integral linearity errors which can be avoided by careful design as follows.

FIG. 4 shows that each comparator requires averaging information from the comparators above and below it. This makes it difficult to terminate the array of comparators. One method of terminating the array is to use additional amplifiers at each of the reference resistor chain. The number of added amplifiers should be such that the endmost added amplifier is in its saturated region of operation when the endmost latch is at its threshold. Or, a circuit could be used which effectively simulates the presence of additional amplifiers at each end of the full scale range. Also, the horizontal averaging ladder 66 shown in FIG. 9 should be terminated with proper resistances and driven by proper currents such that the ladder appears infinite. The other end of the ladder is well suited for this purpose.

The embodiment shown in FIG. 9 has other integral linearity sensitivities. Any bus drops or process gradients in the current sources 34 can cause linearity errors. Also, process gradients in the averaging resistor ladder 66 or the amplifier collector load resistors 36 and 38 can cause linearity errors. Careful design and layout will avoid these problems. The Early effect in the differential amplifiers 30 and 32 can cause linearity errors, which can be eliminated by adding another gain stage to the amplifier to improve the CMRR.

The traditional design of a flash A/D converter requires that all the comparators be as identical as possible, including capacitive loading at the various amplifier nodes. The use of the embodiment shown in FIG. 9 makes this difficult if the comparators are arranged in rows and columns, because the distance between columns is different from that between rows. This will generate unequal load capacitances in the comparators at the ends of the columns, due to the capacitive loading of the metal traces which carry the averaging information. For this reason, it is recommended that the invention be utilized in flash A/D converters which have one or two columns of amplifiers at the most. Another method of reducing the effect of the unequal loading is to ensure that the A/D converter is driven by a track and hold.

Thus, the invention must be utilized carefully but there are tremendous benefits associated with doing so. In particular, this invention allows the design of high accuracy A/D converters without the concern of transistor mismatches, and without the speed, cost or device count penalties associated with previous techniques. Transistor mismatches have historically been the most significant problem associated with high speed A/D conversion, and this invention translates the problem into others which are relatively easy to solve. It will also be appreciated that, although several embodiments of the invention have been described in detail for purposes of illustration, various modifications may be made without departing from the spirit and scope of the invention. For example, although some of the embodiments have been described in an NPN bipolar process the invention can be implemented in CMOS, BiCMOS, JFET, NMOS, PMOS, MESFET, PNP, or complementary bipolar processes in silicon, gallium arsenide, germanium or other material. Accordingly, the invention is not to be limited except as by the appended claims.

I claim:

1. A quantizer circuit, comprising:

N analog amplifiers, where N is a positive integer, having input terminals and output terminals;

means for coupling an array of input reference signals to input terminals of the analog amplifiers, where the analog amplifiers are positioned in a sequence corresponding to the values of the analog input reference signals;

input means for also coupling the analog input signal to inputs of the analog amplifiers;

M threshold circuits for generating a binary output, where M is a positive integer greater than N, said threshold circuits being positioned in a sequence similar to the amplifiers' sequence, with an amplifier corresponding to a given threshold circuit being referred to as a principal amplifier; and analog signal combining means having substantially N inputs and M outputs, which includes a resistor ladder having a first set of tap points that form the input terminals and a second set of tap points that form the output terminals, connected between the analog amplifiers and the threshold circuits, which derive each threshold circuit analog input signal from the weighted sum of the analog outputs of the principal amplifiers and other neighboring amplifiers.

2. A quantizer circuit for converting an analog input signal to a digital output signal, comprising:

plurality of analog amplifiers each having input terminals and output terminals;

means for coupling an array of input reference signals to input terminals of the analog amplifiers;

input means for also coupling the analog input signal to inputs of the analog amplifiers;

a plurality of threshold circuits for generating a binary output signal of a given state when an analog input thereto is greater than a predetermined voltage; and signal combining means which includes a resistor ladder having a first set of tap points that form the input terminals and a second set of tap points that form the output terminals, said signal combining means being connected between the analog amplifiers and the threshold circuits, to receive signals from the output terminals of the amplifiers, and to provide input signals to the threshold circuits, said signal combining means providing analog inputs to most of the threshold circuits having a voltage level derived from the weighted sum of the outputs from a plurality of the analog amplifiers operating in a non-saturated mode, whereby summing analog outputs from multiple analog amplifiers has the effect of improving differential and integral linearity in the event of any component mismatch errors in the analog amplifiers, wherein the amplifiers are positioned in a sequence corresponding to the values of the input reference signals;

the threshold circuits are positioned in a similar sequence, with an amplifier corresponding to a given threshold circuit being referred to as a principal amplifier;

the signal combining means derives each threshold circuit analog input signal from the outputs of one or more principal amplifiers located near the position corresponding to the threshold circuit, and from a plurality of other amplifiers located near the principal amplifier;

there are N analog amplifiers and M threshold circuits, where N is less than M and wherein N and M are positive integers; and the analog signal combining means has substantially N analog inputs and substantially M analog outputs, and an interpolation function is performed between the outputs of the combining means, wherein an analog output signal on any of the M outputs is derived by interpolating between the closest of the N analog inputs and by adding weighted contributions from others of the N analog inputs.

3. A quantizer circuit for converting an analog input signal to a digital output signal, comprising:

A plurality of analog amplifiers each having input terminals and output terminals;

means for coupling an array of input reference signals to input terminals of the analog amplifiers;

input means for also coupling the analog input signal to inputs of the analog amplifiers;

a plurality of threshold circuits for generating a binary output signal of a given state when an analog input thereto is greater than a predetermined voltage; and signal combining means, connected between the analog amplifiers and the threshold circuits, to receive signals from the output terminals of the amplifiers, and to provide input signals to the threshold circuits, said signal combining means providing analog inputs to most of the threshold circuits having a voltage level derived from the weighted sum of the outputs from a plurality of the analog amplifiers operating in a non-saturated mode, whereby summing analog outputs from multiple analog amplifiers has the effect of improving differential and integral linearity in the event of any component mismatch errors in the analog amplifiers, wherein, each of the amplifiers is a different amplifier which has an emitter-follower output stage, and said amplifiers are positioned in a sequence corresponding to the values of the input reference signals;

the threshold circuits are positioned in a similar sequence, with an amplifier corresponding to a given threshold circuit being referred to as a principal amplifier;

the signal combining means includes a resistor ladder having substantially 2N input taps and 2M outputs taps, said signal combining means derives each threshold circuit analog input signal from the outputs of one or more principal amplifiers located near the position corresponding to the threshold circuit, and from a plurality of other amplifiers located near the principal amplifier;

there are N analog amplifiers and M threshold circuits, where N is less than M and wherein N and M are positive integers;

the analog signal combining means has substantially N analog inputs and substantially M analog outputs, and an interpolation function is performed between the outputs of the combining means, wherein an analog output signal on any of the M outputs is derived by interpolating between the closest of the N analog inputs and by adding weighted contributions from others of the N analog inputs; and the quantizer circuit further comprises substantially 2N coupling resistors connecting the emitter outputs of the emitter follower stages to the resistor ladder, to effect weighted summing of the inputs to the ladder.

4. A quantizer circuit as defined in claim 3, wherein:

the 2N coupling resistors have values greater than the resistance of the resistor ladder segments between adjacent input taps.

5. A quantizer circuit for converting an analog input signal to a digital output signal, comprising:

plurality of analog amplifiers each having input terminals and output terminals;

means for coupling an array of input reference signals to input terminals of the analog amplifiers;

input means for also coupling the analog input signal to inputs of the analog amplifiers;

a plurality of threshold circuits for generating a binary output signal of a given state when an analog input thereto is greater than a predetermined voltage; and signal combining means connected between the analog amplifiers and the threshold circuits, to receive signals from the output terminals of the amplifiers, and to provide input signals to the threshold circuits, said signal combining means providing analog inputs to most of the threshold circuits having a voltage level derived from the weighted sum of the outputs from a plurality of the analog amplifiers operating in a non-saturated mode, whereby summing analog outputs from multiple analog amplifiers has the effect of improving differential and integral linearity in the event of any component mismatch errors in the analog amplifiers, wherein, each of the amplifiers is a differential amplifier and said amplifiers are positioned in a sequence corresponding to the values of the input reference signals;

the threshold circuits are positioned in a similar sequence, with an amplifier corresponding to a given threshold circuit being referred to as a principal amplifier; and the signal combining means derives each threshold circuit analog input signal from the outputs of one or more principal amplifiers located near the position corresponding to the threshold circuit, and from a plurality of other amplifiers located near the principal amplifier;

there are N analog amplifiers and M threshold circuits, where N is less than M and wherein N and M are positive integers;

the analog signal combining means has substantially N analog inputs and substantially M analog outputs, and an interpolation function is performed between the outputs of the combining means, wherein an analog output signal on any of the M outputs is derived by interpolating between the closest of the N analog inputs, and by adding weighted contributions from others of the N analog inputs;

the signal combining means includes a resistor ladder having substantially 2N input taps and 2M output taps; and the differential amplifiers have their outputs directly coupled to the 2N input taps in the resistor ladder, to effect weighted summing and interpolation of the inputs to the ladder.

6. A quantizer as defined in claim 5, wherein, the differential amplifier output impedance is greater than the resistance of the resistor ladder segments between adjacent input taps.

7. A quantizer circuit for converting an analog input signal to a digital output signal, comprising:
a plurality of analog amplifiers each having input terminals and output terminals;
means for coupling an array of input reference signals to input terminals of the analog amplifiers;
input means for also coupling the analog signal to inputs of the analog amplifiers;
a plurality of threshold circuits for generating a binary output signal of a given state when an analog input thereto is greater than a predetermined voltage; and
signal combining means, connected between the analog amplifiers and the threshold circuits, to receive signals from the output terminals of the amplifiers, and to provide input input signals to the threshold circuits, said signal combining means providing analog inputs to most of the threshold circuits having a voltage level derived from the weighted sum of the outputs from a plurality of the analog amplifiers operating in a non-saturated mode, whereby summing analog outputs from multiple analog amplifiers has the effect of improving differential and integral linearity in the event of any component mismatch errors in the analog amplifiers,
wherein,
each of the amplifiers is a differential amplifier;
the signal combining means includes a resistor ladder;
the outputs of each differential amplifier are connected to tap points in the resistor ladder; and
the resistor ladder generates outputs to the threshold circuits.

8. A quantizer circuit as defined in claim 7, wherein:
there are equal numbers of threshold circuits and amplifiers; and
the signal combining means provides an input to threshold circuit n proportional to the sum of the output from amplifier n, and the outputs from other amplifiers multiplied by weighting factors less than unity.

9. An analog-to-digital converter, comprising:
a plurality of analog amplifiers each having two input terminals and a plurality of output terminals;
a reference signal resistor ladder, to provide an array of input reference signals to a first of the input terminals of the amplifiers;
means for coupling an analog input signal to the other of the input terminals of the amplifiers, wherein each amplifier generates a signal indicative of the difference between the analog input signal and an input reference signal corresponding to one of a plurality of reference levels spaced over an analog signal range of interest;
a plurality of thresholding circuits for receiving analog input signals and generating quantized signal outputs;
signal combining means including a resistor ladder having a first set of tap points that form the input terminals and a second set of tap points that form the output terminals, said signal combining means connected between the amplifiers and the thresholding circuits, to receive signals from the output terminals of the amplifiers, and to provide input signals to the thresholding circuits, wherein each of the thresholding circuits receives an input signal derived from the weighted sum of the outputs from a plurality of amplifiers operating in a non-saturated mode, whereby summing analog outputs from multiple amplifiers has the effect of improving differential and integral linearity in the event of any amplifier offset errors; and
a decoder to receive converted signals from most of the analog-to-digital thresholding circuits and to generate therefrom a digital signal indicative of the magnitude of the analog input signal,
wherein,
the amplifiers are positioned in a sequence corresponding to the values of the input reference signals;
the thresholding circuits are positioned in a similar sequence, with an amplifier corresponding to a given threshold circuit being referred to as a principal amplifier;
the signal combining means derives each thresholding circuit input signal from the outputs of one or more principal amplifiers located near the position corresponding to the thresholding circuit, and from a plurality of other amplifiers located near the principal amplifier;
there are N amplifiers and M thresholding circuits, where N is less than M and wherein both N and M are positive integers; and
the signal combining means has substantially N inputs and M outputs, and an interpolation function is performed between the outputs of the signal combining means, wherein an output signal on any of the M outputs is derived by interpolating between the closest of the N inputs, and by adding weighted contributions from others of the N inputs.

10. An analog-to-digital converter, comprising:
a plurality of analog amplifiers each having two input terminals and a plurality of output terminals;
a reference signal resistor ladder, to provide an array of input reference signals to a first of the input terminals of the amplifiers;
means for coupling an analog input signal to the other of the input terminals of the amplifiers, wherein each amplifier generates a signal indicative of the difference between the analog input signal and an input reference signal corresponding to one of a plurality of reference levels spaced over an analog signal range of interest;
a plurality of thresholding circuits for receiving analog input signals and generating quantized signal outputs;
signal combining means, connected between the amplifiers and the thresholding circuits, to receive signals from the output terminals of the amplifiers, and to provide input signals to the thresholding circuits, wherein each of the thresholding circuits receives an input signal derived from the weighted sum of the outputs from a plurality of amplifiers operating in a non-saturated mode, whereby summing analog outputs from multiple amplifiers has the effect of improving differential and integral linearity in the event of any amplifier offset errors; and
a decoder to receive converted signals from most of the analog-to-digital thresholding circuits and to generate therefrom a digital signal indicative of the magnitude of the analog input signal, wherein, each of the amplifiers is a differential amplifier which has an emitter-follower output stage and said amplifiers are positioned in a sequence corresponding to the values of the input reference signals;

the thresholding circuits are positioned in a similar sequence, with an amplifier corresponding to a given threshold circuit being referred to as a principal amplifier;

the signal combining means includes a resistor ladder having substantially 2N input taps and 2M output taps, said signal combining means derives each thesholding circuit input signal from the outputs of one or more principal amplifiers located near the position corresponding to the thresholding circuit, and from a plurality of other amplifiers located near the principal amplifier;

there are N amplifiers and M thresholding circuits, where N is less than M and wherein both N and M are positive integers;

the signal combining means has substantially N inputs and M outputs, and an interpolation function is performed between the outputs of the signal combining means, wherein an output signal on any of the M outputs is derived by interpolating between the closest of the N inputs, and by adding weighted contributions from others of the N inputs; and the analog-to-digital converter further comprises substantially 2N coupling resistors connecting the emitter outputs of the emitter follower stages to the resistor ladder, to effect weighted summing of the inputs to the ladder.

11. An analog-to-digital converter as defined in claim 10, wherein:

the 2N coupling resistors have values greater than the resistance of the resistor ladder segments between adjacent input taps.

12. An analog-to-digital converter, comprising:

a plurality of analog amplifiers each having two input terminals and a plurality of output terminals;

a reference signal resistor ladder, to provide an array of input reference signals to a first of the input terminals of the amplifiers;

means for coupling an analog input signal to the other of the input terminals of the amplifiers, wherein each amplifier generates a signal indicative of the difference between the analog input signal and an input reference signal corresponding to one of a plurality of reference levels spaced over an analog signal range of interest;

a plurality of thresholding circuits for receiving analog input signals and generating quantized signal outputs;

signal combining means, connected between the amplifiers and the thresholding circuits, to receive signals from the output terminals of the amplifiers, and to provide input signals to the thresholding circuits, wherein each of the thresholding circuits receives an input signal derived from the weighted sum of the outputs from a plurality of amplifiers operating in a non-saturated mode, whereby summing analog outputs from multiple amplifiers has the effect of improving differential and integral linearity in the event of any amplifier offset errors; and a decoder to receive converted signals from most of the analog-to-digital thresholding circuits and to generate therefrom a digital signal indicative of the magnitude of the analog input signal, wherein, each of the amplifiers is a differential amplifier and the amplifiers are positioned in a sequence corresponding to the values of the input reference signals;

the thresholding circuits are positioned in a similar sequence, with an amplifier corresponding to a given threshold circuit being referred to as a principal amplifier;

the signal combining means derives each thresholding circuit input signal from the outputs of one or more principal amplifiers located near the position corresponding to the thresholding circuit, and from a plurality of other amplifiers located near the principal amplifier;

there are N amplifiers and M thresholding circuits, where N is less than M and wherein both N and M are positive integers;

the signal combining means has substantially N inputs and M outputs, and an interpolation function is performed between the outputs of the signal combining means, wherein an output signal on any of the M outputs is derived by interpolating between the closest of the N inputs, and by adding weighted contributions from others of the N inputs;

the signal combining means includes a resistor ladder having substantially 2N input taps and 2M output taps; and the differential amplifiers have their outputs directly coupled to the 2N input taps in the resistor ladder, to effect weighted summing and interpolation of the inputs to the ladder.

13. An analog-to-digital converter as defined in claim 12, wherein:

the differential amplifier output impedance is greater than the resistance of the resistor ladder segments between adjacent input taps.

14. An analog-to-digital converter, comprising:

a plurality of analog amplifiers each having two input terminals and a plurality of output terminals;

a reference signal resistor ladder, to provide an array of input reference signals to a first of the input terminals of the amplifiers;

means for coupling an analog input signal to the other of the input terminals of the amplifiers, wherein each amplifier generates a signal indicative of the difference between the analog input signal and an input reference signal corresponding to one of a plurality of reference levels spaced over an analog signal range of interest;

a plurality of thresholding circuits for receiving analog input signals and generating quantized signal outputs;

signal combining means, connected between the amplifiers and the thresholding circuits, to receive signals from the output terminals of the amplifiers, and to provide input signals to the thresholding circuits, wherein each of the thresholding circuits receives an input signal derived from the weighted sum of the outputs from a plurality of amplifiers operating in a non-saturated mode, whereby summing analog outputs from multiple amplifiers has the effect of improving differential and integral linearity in the event of any amplifier offset errors; and a decoder to receive converted signals from most of the analog-to-digital thresholding circuits and to generate therefrom a digital signal indicative of the magnitude of the analog input signal, wherein, each of the amplifiers is a differential amplifier;

the signal combining means includes a resistor ladder;

the outputs of each differential amplifier are connected to tap points in the resistor ladder; and the resistor ladder generates outputs to the thresholding circuits from the tap points in the resistor ladder.

15. An analog-to-digital converter as defined in claim 14, wherein:

there are equal numbers of thresholding circuits and amplifiers; and the signal summing means provides an input to thresholding circuit n proportional to the sum of the output from amplifier n, and the outputs from other amplifiers multiplied by weighting factors less than unity.

* * * * *